United States Patent
Roldan et al.

(10) Patent No.: US 10,811,795 B2
(45) Date of Patent: Oct. 20, 2020

(54) CONNECTION MODULE FOR AN AUTOMOTIVE VEHICLE

(71) Applicant: VALEO ILUMINACION, Martos (ES)

(72) Inventors: Jose-David Roldan, Martos (ES); Tomas Martinez-Zaldivar, Martos (ES); Juan-Francisco Moreno, Martos (ES)

(73) Assignee: VALEO ILUMINACION, Martos (ES)

( * ) Notice: Subject to any disclaimer, the term of this patent is extended or adjusted under 35 U.S.C. 154(b) by 0 days.

(21) Appl. No.: 15/903,479

(22) Filed: Feb. 23, 2018

(65) Prior Publication Data

US 2018/0241141 A1    Aug. 23, 2018

(30) Foreign Application Priority Data

Feb. 23, 2017   (EP) .................................... 17382088

(51) Int. Cl.
| | |
|---|---|
| *H01R 12/72* | (2011.01) |
| *H05K 3/40* | (2006.01) |
| *H01R 13/627* | (2006.01) |
| *F21K 9/20* | (2016.01) |
| *H01R 12/79* | (2011.01) |

(52) U.S. Cl.
CPC ........ *H01R 12/721* (2013.01); *H01R 13/6271* (2013.01); *H01R 13/6272* (2013.01); *H05K 3/403* (2013.01); *F21K 9/20* (2016.08); *H01R 12/79* (2013.01); *H01R 2201/26* (2013.01); *H05K 2201/09145* (2013.01)

(58) Field of Classification Search
CPC .............. H01R 12/725; H01R 12/7005; H01R 12/722; H01R 13/6272; H01R 12/721; H01R 2201/26; F21K 9/20; H05K 3/403; H05K 2201/09145
See application file for complete search history.

(56) References Cited

U.S. PATENT DOCUMENTS

| | | | | |
|---|---|---|---|---|
| 4,521,065 A | * | 6/1985 | Nestor | H01R 12/721 439/328 |
| 5,035,641 A | * | 7/1991 | Van-Santbrink | H01R 12/7023 439/329 |
| 5,319,523 A | * | 6/1994 | Ganthier | H05K 1/117 361/753 |
| 5,702,271 A | * | 12/1997 | Steinman | H01R 24/64 439/676 |
| 5,777,855 A | * | 7/1998 | Yokajty | H01R 12/62 361/749 |
| 5,944,536 A | * | 8/1999 | Seong | H01R 43/0256 439/328 |
| 5,954,536 A | * | 9/1999 | Fuerst | H01R 12/79 439/493 |
| 6,062,911 A | * | 5/2000 | Davis | H01R 13/2492 439/630 |

(Continued)

*Primary Examiner* — Briggitte R. Hammond
(74) *Attorney, Agent, or Firm* — Oblon, McClelland, Maier & Neustadt, L.L.P.

(57) ABSTRACT

The invention provides an electrical connection module for an automotive vehicle. The module includes a printed circuit board, PCB, and a connector for connecting a wire harness to said PCB. An edge of the PCB can be inserted into the connector. The module provides retention mechanism that is integral to the PCB. The retention mechanism is shaped and configured to retain the edge connector, if the PCB is seated therein.

14 Claims, 2 Drawing Sheets

(56) References Cited

U.S. PATENT DOCUMENTS

| | | | | |
|---|---|---|---|---|
| 6,171,141 B1* | 1/2001 | Yasui | ................ | F16C 1/105 |
| | | | | 439/354 |
| 7,182,610 B2* | 2/2007 | Lin | ................ | H01R 12/707 |
| | | | | 439/567 |
| 7,710,740 B2* | 5/2010 | Liu | ................ | H05K 1/147 |
| | | | | 361/748 |
| 7,883,369 B1* | 2/2011 | Sun | ................ | H01R 12/7011 |
| | | | | 439/607.35 |
| 7,955,112 B2* | 6/2011 | Yang | ................ | H01R 12/721 |
| | | | | 439/328 |
| 8,272,897 B1* | 9/2012 | Lin | ................ | H01R 13/6594 |
| | | | | 439/607.4 |
| 8,450,620 B2* | 5/2013 | Cai | ................ | H01R 12/721 |
| | | | | 174/250 |
| 9,426,889 B2* | 8/2016 | Liu | ................ | H05K 1/147 |
| 2007/0171667 A1* | 7/2007 | Watanabe | ................ | F21V 19/0015 |
| | | | | 362/545 |
| 2010/0261369 A1* | 10/2010 | Satoh | ................ | H01R 12/79 |
| | | | | 439/328 |

* cited by examiner

CONNECTION MODULE FOR AN AUTOMOTIVE VEHICLE

It is known to use several types of electrical connectors, including plug and socket-type devices, to electrically connect an electronic circuit, which is implemented on a printed circuit board, PCB, to a remote device. The remote device may for example be a power supply, which supplies electrical current to the electronic circuit via a harness having at least one wire terminating in the electrical connector. The electrical connector interfaces with the electronic circuit on the PCB.

A specific type of connector known in the art is the "cardedge" connector. The connector features a body for connecting the wires of a wire harness. A pair of opposing jaws extends from the body and is configured to receive a printed circuit board supporting an electronic circuit therebetween. The jaws comprise electrical contacts, which are electrically connected to the wire harness through the connector's body. The arrangement is such that the electrical contacts located on the jaws establish contact with a corresponding electrically conductive area on the PCB that is pinched between the jaws.

However, if the PCB is not properly inserted between the jaws of the cardedge connector, or, if either or both of the PCB and the connector are subject to vibrations or shocks during use, the connector may become disconnected from the PCB. Such an incident may only be attended to by manual intervention. This situation is particularly critical when the cardegdge connector, which has the benefit of having a small footprint, is used in a lighting module for an automotive car. Typically, physical space is a major constraint in such an environment, so that the use of a cardedge-type connector is interesting. However, an automotive vehicle is subject to vibrations or shocks, so that it becomes likely for the connector to disconnect during use. Moreover, the manual intervention required to fix the connection is often work-intensive as well as costly, because many components of the automotive vehicle may have to be removed before the connector and PCB become accessible—if they are accessible at all.

It has been suggested to mount the connector with its rear face abutted against a wall, thereby decreasing the likelihood of disconnection from the PCB to which it is connected. This imposes severe design and placement constraints on the PCB, which has to be located in close proximity to a wall of a device.

It is an objective of the present invention to alleviate at least some of the drawbacks found in the prior art.

In accordance with a first aspect of the invention, an electrical connection module for an automotive vehicle is provided. The module comprises a printed circuit board, PCB, and an edge connector for connecting a wire harness to said PCB, into which edge connector an edge of the PCB is insertable. The PCB comprises retention means, which are formed thereon, and which are adapted to retain said edge connector, if the edge of the PCB is seated therein.

The retention means are advantageously integrally formed on the PCB. As variants, the retention means can be overmolded and/or clipped on the PCB.

The edge of the PCB insertable into the edge connector may preferably form a recessed edge portion.

Preferably, the retention means may comprise at least one arm, preferably a pair of arms, extending from the PCB in the direction of insertion of the edge of the PCB into the edge connector, the arm or each arm comprising a hand configured for grasping a back side of said edge connector.

The arm(s) may preferably be configured as flexible clips.

The retention means may preferably comprise a resilient flexible portion which extends in a direction that is generally perpendicular to the direction of insertion of the edge of the PCB into the edge connector. The resilient flexible portion is preferably integrally formed on the PCB.

The resilient flexible portion may preferably be a rib configured for being bent out of the PCB's plane when inserting the edge of the PCB into the edge connector.

The rib or arms may be formed by cutting out at least one neighbouring region from the PCB.

Preferably, the resilient flexible portion may contact a back side of the edge connector, when the PCB is seated therein.

The retention means may preferably be formed in a reinforced region of the PCB. The reinforced region may locally comprise a board thickness that is larger than the overall board thickness of the PCB.

Preferably, the retention means may be formed so that they are flush with the edge of the PCB.

The edge connector may preferably comprise a main body for connecting a wire harness, and a pair of opposing jaws for receiving the edge of the PCB therebetween.

The PCB may preferably comprise an electronic circuit having at least one light source, and the edge connector may be used to connect said PCT to a power supply through a wire harness.

Preferably, the light source is a light emitting diode, LED, or a Laser diode.

In accordance with a further aspect of the invention a lighting module for an automotive vehicle is provided. The lighting module comprises a PCB that supports an electronic circuit having at least one light source. The module further comprises a wire harness connecting said electronic circuit to an electric current source by means of an edge connector. The PCB and the edge connector are part of an electrical connection module according to the invention.

The invention allows securing a cardedge-type connector to a printed circuit board, PCB, while significantly reducing the risk of disconnection, even if the assembly is subject to vibrations and/or shocks after the connection has been established. By using specific holding features or retention means directly embedded in the PCB itself, there is no need to use a third part to secure the connection. This feature reduces the overall footprint of the connection module, and reduces production costs. Obviously, the maintenance time is reduced as the risk of disconnection is lowered. The disconnection-proof connection module further alleviates the constraints for mounting a PCB-cardedge module. Specifically, the module does not have to be mounted in proximity of a wall of the containing device as in prior art solutions. The above advantages render the connection module according to the invention particularly appealing for the automotive lighting industry, where connected modules are subject to vibrations, where physical space is a scarce resource, and where maintenance interventions are difficult to achieve.

Several embodiments of the present invention are illustrated by way of figures, which do not limit the scope of the invention, wherein.

This section describes the invention in further detail based on preferred embodiments and on the figures. It should be noted that features described for a specific embodiment described herein may be combined with the features of other embodiments unless the contrary is explicitly mentioned. Similar features are referenced with similar numbers across multiple embodiments, wherein the reference numbers are, unless otherwise stated, incremented by one hundred when moving to the next embodiment. For example, reference numbers 100 and 200 both describe an electrical connection module in accordance with the invention, in two separate embodiments thereof.

It should be understood that the detailed description of specific preferred embodiments is given by way of illustration only, since various changes and modifications within the scope of the invention will be apparent to the person skilled in the art. The scope of protection is defined by the following set of claims.

It is known to produce printed circuit boards, PCB, from a synthetic resin and to print or deposit electrically conductive traces thereon, which interconnect surface mounted devices or components of the electronic circuit to provide a specific function. Processes for producing a PCB or for creating such conductive traces thereon will not be described in the context of the present invention.

Figure 1:
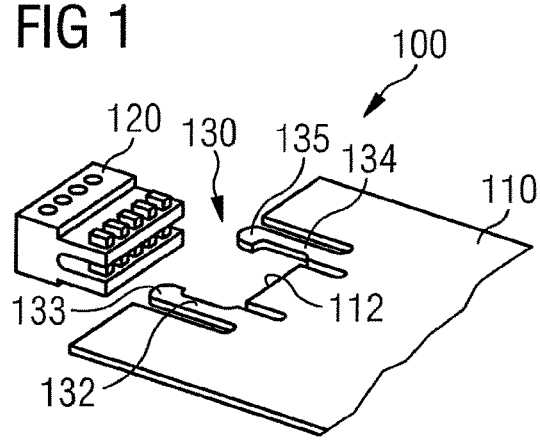
FIG. 1 is a perspective view illustration of an electrical connection module according to a preferred embodiment of the invention, wherein the PCB is not seated in the connector.
Figure 2:
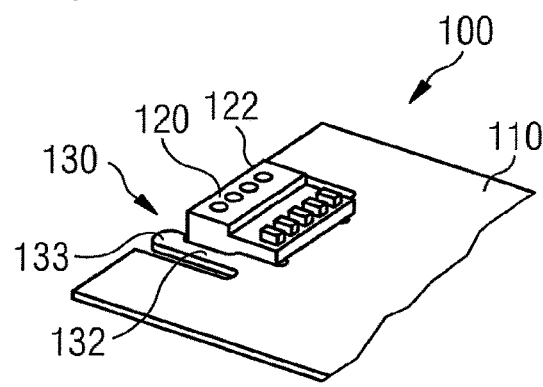
FIG. 2 is a perspective view illustration of an electrical connection module according to a preferred embodiment of the invention, wherein the PCB is seated in the connector.

FIG. 1 show an electrical connection module 100 in accordance with a first embodiment of the invention. The module 100 comprises a PCB 110 and an edge connector 120. The connector 120 is used for connecting a wire harness, which is not shown, to the PCB. An edge 112 of the PCB is insertable into the connector 120, which possesses a pair of jaws for receiving the PCB therebetween. As shown on FIG. 1, the connector comprises a main body that may be perceived by the series of round openings therein, in which conducting wires of a wire harness may be received and fixed. The pair of opposing jaws extends from the main body in the direction of the PCB 110. The connector comprises electrical connections which allow establishing an electrical contact between the wire-receiving part and the PCB-contacting part thereof. The PCB comprises retention means 130, integrally formed thereon, which are adapted to retain the edge connector, when the PCB is seated therein. In FIG. 1, the arms 132, 134 of the retention means 130 are visible as the PCB is not seated in the connector. The arms 132, 134 are preferably produced by cutting out part of the PCB's rigid and generally rectangular support plate. By doing so, the production of the arms does not require any additional tools or parts, and the ends of the arms are generally flush with the PCB's edge contour. Alternatively, the arms may protrude from the generally rectangular contour of the PCB. In the illustrated example, the ends of the arms 132, 134 are equipped with hands 133, 134 respectively, extending inwards towards each other. The distance between the arms is such that the breadth of an edge connector can be accommodated therebetween, wherein the depth of the bay-like cut-out or recess of the PCB is such that the depth of an edge connector can be lodged therein. The arms are thin enough to be slightly flexible yet resilient, so that when a connector 120 is pushed towards the PCB, the hands 133, 135 contact the sides of the connector, which thereby laterally pushes both arms 132, 134 outwards and away from each other, in a direction perpendicular to the direction of insertion. Once the connector is seated properly, the arms snap back into their original position and the hands 133, 135 contact a backside 122 of the edge connector 120, as illustrated in FIG. 2, thereby retaining it and keeping it from moving away from the PCB 110. The hands and arms effectively implement a clipping mechanism. Other shapes of arms and/or hands than those shown may be implemented by the skilled person without leaving the scope of the present invention, for as long as they mechanically lock the connector 120 in place, once it is seated in said cut-out recess of the PCB.

Figure 3:
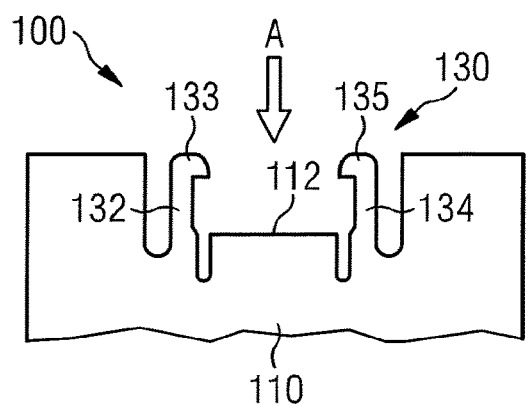
FIG. 3 illustrates the features of a PCB according to a preferred embodiment of the invention.
Figure 4:
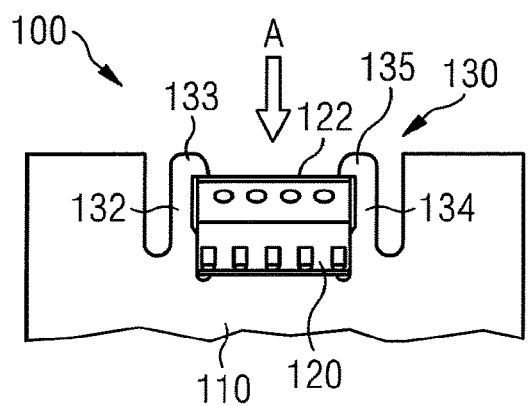
FIG. 4 shows the PCB of FIG. 3, seated in a connector in accordance with a preferred embodiment of the invention.

FIGS. 3 and 4 provide bird's eye views from the PCB shown in FIGS. 1 and 2 respectively. The retention means 130, including arms 132, 134 and associated hands 133, 135 can be clearly seen, while the arrow A indicates the direction from which an edge connector is approached when a connection to the PCB is attempted. In FIG. 4, the PCB 110 is seated between the jaws of the edge connector 120, the back side 122 of which is held by the hands 133, 135. In this setting, the connector 120 may not freely move in the direction opposite to direction A, thereby achieving the effect of the invention.

Figure 5:
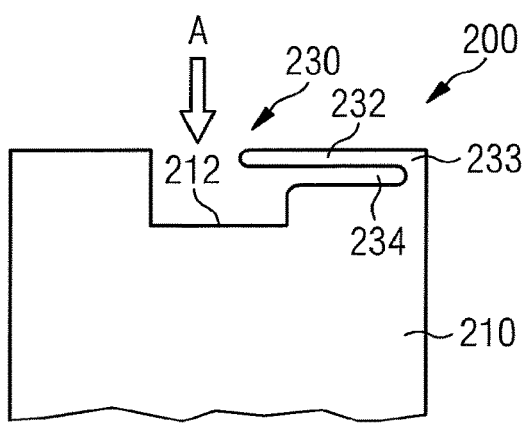
FIG. 5 illustrates the features of a PCB according to a preferred embodiment of the invention.

A second embodiment of the electrical connection module 200 in accordance with the invention is shown in FIGS. 5 to 9. FIG. 5 illustrates a bird's eye view of a PCB 210 having a recessed edge portion 212 along one of its edges. The edge portion may be inserted between the jaws of an edge connector device. In the shown example, the recess is provided by a cut-out of the PCB's main plate. The breadth of the recess is such that the breadth of an edge connector can be accommodated therebetween, wherein the depth of the recess such that the depth of an edge connector can be lodged therein. The dimensions of the recess preferably substantially match the dimensions of the edge connector. The cut-out region 234 is further shaped to provide a rib 232, which extends in a direction that is perpendicular to the direction of insertion of the PCB 210 into the edge connector. The direction of insertion is indicated by the arrow A. The rib 232 is thin enough to be flexible yet resilient. Specifically, the rib 232 is capable of slightly pivoting in the direction that is perpendicular to the plane of illustration. The rib 232, pivot point 233 and cut-out 234 provide the retention means 230 of the claimed device.

Figure 6:
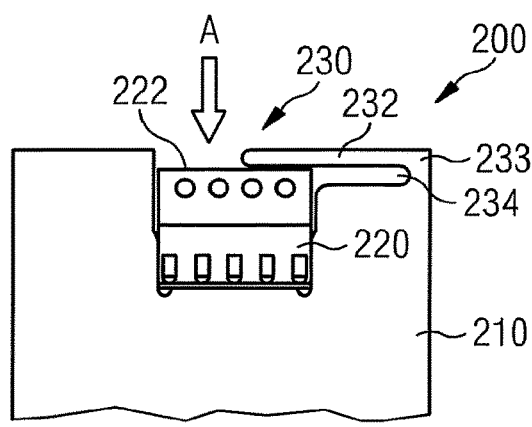
FIG. 6 shows the PCB of FIG. 5, seated in a connector in accordance with a preferred embodiment of the invention.

In FIG. 6, the PCB 210 is seated between the jaws of the edge connector 220, the back side 222 of which is contacted by the rib 232. In this setting, the connector 220 may not freely move in the direction opposite to direction A, thereby achieving the effect of the invention. The length of the rib 232 is long enough to enclose at least part of the back side 222 between itself and the edge region 212 of the PCB that establishes the electrical contact with the connector 220.

Figure 7:
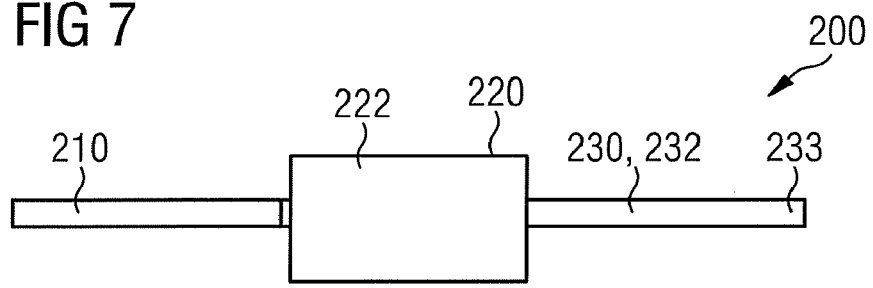
FIGS. 7, 8 and 9 are views depicting the edge of PCB and back side of a connector in accordance with a preferred embodiment of the invention, in different configurations.
Figure 8:
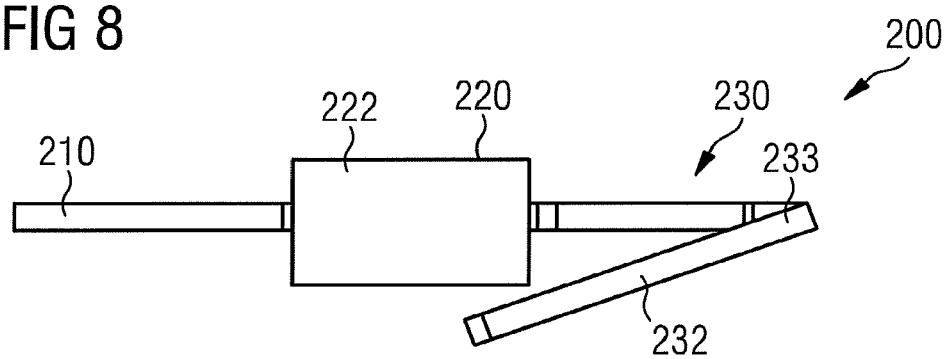
Figure 9:
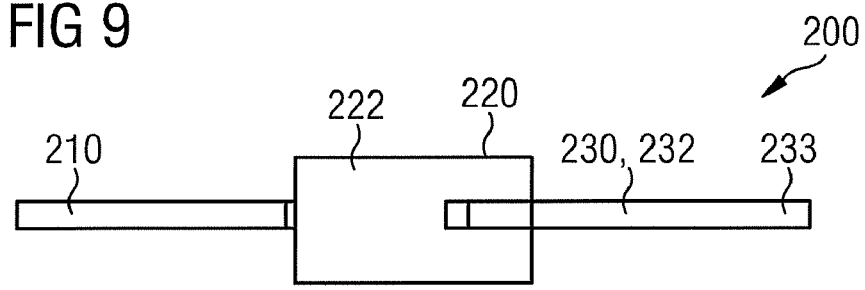

FIGS. 7 to 9 provide insight on how the flexible rib 232 and the connector 220 interact when the PCB 210 is being seated in the connector 220. The view in FIG. 7 shows a lateral view towards the recessed edge of the 210. The recessed edge itself is hidden by the back side 222 of the connector 220. The connector is being approached towards the PCB in the direction entering the image plane. The retention means 230 comprising rib 232 and pivot 233 are located within the main plane of the PCB 210.

In FIG. 8, the rib 232 is pivoted downwards out of the main plane of the PCB 210. This allows the connector 220 to enter the recessed portion of the PCB, previously shown in FIG. 5. The dimensions of the rib 232 are chosen so that the rib does not break or detach from pivot 233 when it is bent to accommodate the connector 220. It should be noted that the rib's dimensions solely depend on the shape of the cut-out that is performed on the initially generally rectangular PCB. The skilled person may therefore readily adapt the dimensions of the rib 232 to any specific constraint arising in a particular application. The PCB's thickness is typically of the order of 2-3 mm.

In FIG. 9, the connector is finally lodged in the recess of the PCB. The recessed edge of the PCB 210 is seated between the opposing jaws of the edge connector 220. The rib 233 resiliently snaps back into its original position by rotating upwards around the pivot 233. The rib thereby aligns with the plane of the PCB 210 and contact at least a portion of the back side 222 of the connector 220. Thereby, the connector automatically locked and may not freely disconnect from the PCB.

The electrical connection modules 100, 200 that have been described, as well as other equivalent embodiments of the invention, are particularly useful, but not restricted, to be used in a lighting module for an automotive vehicle. In such a lighting module, a PCB 110, 210 having the described retention means 130, 230 may comprise one or more light sources, for example light emitting diodes, LED. The driver of theses LEDs, which provides electrical current to the LEDs, is typically remotely located on a separate PCB. The driver connects to the LED's PCB 110, 210 using an edge connector 220, 320 as previously described.

The invention claimed is:

1. An electrical connection module for an automotive vehicle, comprising:
   a printed circuit board (PCB) including a retainer formed thereon, the retainer including a clipping mechanism; and
   an edge connector configured to connect to said PCB at the retainer and to be retained by the retainer when the edge connector is connected to a connection edge of a side of the PCB, the connection edge being insertable into the edge connector, the connection edge of the side of the PCB being recessed relative to a remaining edge of the side of the PCB that extends beyond the electrical connection module,
   wherein the clipping mechanism of the retainer is disposed at a portion of the retainer that is beyond the connection edge of the side of the PCB that is inserted into the edge connector, the clipping mechanism being configured to clip onto the edge connector, and
   the edge connector comprises a main body and a pair of opposing jaws to receive the connection edge of the side of the PCB therebetween, a space in the clipping mechanism to accommodate the main body of the connector being larger than a space in the clipping mechanism to accommodate the opposing jaws.

2. The electrical connection module according to claim 1, wherein the retainer includes at least one arm extending from the PCB in a direction of insertion of the connection edge of the side of the PCB into the edge connector, the clipping mechanism being a hand included in the at least one arm and configured to grasp a back side of said edge connector.

3. The electrical connection module according to claim 2, wherein the at least one arm is configured as at least one flexible clip.

4. The electrical connection module according to claim 1, wherein that the retainer includes a resilient flexible portion which extends in a direction that is perpendicular to a direction of insertion of the connection edge of the side of the PCB into the edge connector.

5. The electrical connection module according to claim 4, wherein the resilient flexible portion is a rib configured to bend out of the PCB's plane when inserting the connection edge of the side of the PCB into the edge connector.

6. The electrical connection module according to claim 4, wherein the resilient flexible portion contacts a back side of the edge connector when the PCB is seated therein.

7. The electrical connection module according to claim 1, wherein the retainer is formed in a reinforced region of the PCB.

8. The electrical connection module according to claim 1, wherein the retainer is formed to be flush with the remaining edge of the side of the PCB.

9. A lighting assembly for an automotive vehicle, comprising:
   an edge connector; and
   a printed circuit board (PCB) comprising a retainer, which is formed on a side of the PCB, and which is configured to retain the edge connector when a connection edge of the PCB that is disposed on the side of the PCB is seated in the edge connector and the retainer includes a clipping mechanism disposed at a portion of the retainer that is beyond the connection edge of the PCB that is inserted into the edge connector, the clipping mechanism being configured to clip onto the edge connector,
   wherein the retainer includes at least one arm extending from the PCB in a direction of insertion of the connection edge of the PCB into the edge connector, the clipping mechanism being a hand included in the at least one arm and configured to grasp a back side of the edge connector.

10. A lighting assembly for an automotive vehicle, comprising:
    an edge connector; and
    a printed circuit board (PCB) comprising a retainer, which is formed on a side of the PCB, and which is configured to retain the edge connector when a connection edge of the PCB that is disposed on the side of the PCB is seated in the edge connector and the retainer includes a clipping mechanism disposed at a portion of the retainer that is beyond the connection edge of the PCB that is inserted into the edge connector, the clipping mechanism being configured to clip onto the edge connector,
    wherein the retainer includes a resilient flexible portion which extends in a direction that is perpendicular to a direction of insertion of the connection edge of the side of the PCB into the edge connector.

11. The lighting assembly according to claim 10, wherein the resilient flexible portion contacts a back side of the edge connector when the PCB is seated therein.

12. The lighting assembly according to claim 9, wherein the retainer is formed in a reinforced region of the PCB.

13. The lighting assembly according to claim 9, wherein the retainer is formed to be flush with the remaining edge of the PCB.

14. The lighting assembly according to claim 9, wherein the edge connector comprises a main body and a pair of opposing jaws to receive the connection edge of the PCB therebetween.

* * * * *